US005566448A

United States Patent [19]
Bhatt et al.

[11] Patent Number: 5,566,448
[45] Date of Patent: Oct. 22, 1996

[54] METHOD OF CONSTRUCTION FOR MULTI-TIERED CAVITIES USED IN LAMINATE CARRIERS

[75] Inventors: Ashwinkumar C. Bhatt; Thomas P. Duffy, both of Endicott; Jeffrey A. Knight, Endwell, all of N.Y.; James P. Walsh, Vandling, Pa.

[73] Assignee: International Business Machines Corporation, Armonk, N.Y.

[21] Appl. No.: 470,389

[22] Filed: Jun. 6, 1995

[51] Int. Cl.⁶ .................................................. H05K 3/34
[52] U.S. Cl. ............................ 29/840; 29/832; 29/852
[58] Field of Search ............................ 29/840, 832, 852; 257/684; 174/52.1, 52.2; 361/737, 761, 762–764, 820; 156/253

[56] References Cited

U.S. PATENT DOCUMENTS

| | | | |
|---|---|---|---|
| 4,342,064 | 7/1982 | Link | 361/764 |
| 4,633,573 | 1/1987 | Scherer . | |
| 4,751,482 | 6/1988 | Fukuta et al. | 361/344 |
| 4,882,212 | 11/1989 | SinghDeo et al. . | |
| 4,975,761 | 12/1990 | Chu . | |
| 5,155,067 | 10/1992 | Wood et al. . | |
| 5,235,496 | 8/1993 | Chomette et al. . | |
| 5,241,456 | 8/1993 | Marcinkiewicz et al. . | |
| 5,262,927 | 11/1993 | Chia et al. | 257/678 |
| 5,291,062 | 3/1994 | Higgins, III . | |
| 5,324,888 | 6/1994 | Tyler et al. . | |

FOREIGN PATENT DOCUMENTS 2-237142  9/1990  Japan .
5-211256  8/1993  Japan .

OTHER PUBLICATIONS

"IBM Technical Disclosure Bulletin," vol. 27, No. 2, Jul., 1984, p. 1139.

*Primary Examiner*—Larry I. Schwartz
*Assistant Examiner*—Adrian Coley
*Attorney, Agent, or Firm*—Calfee, Halter & Griswold

[57] ABSTRACT

A method of forming an I/C chip mounting module, and for mounting an I/C chip thereon, is disclosed. A rigid cap and substrate are provided. A bottomed cavity is routed in the cap, and the substrate has circuitry formed thereon. The cap and substrate are laminated together with bond pads, which connect to the circuitry being disposed in the cavity. After circuitization of the exposed surface of the cap and drilling and plating of vias, the material of the cap overlying the cavity is removed to expose the bond pads. Thereafter, an I/C chip is connect to the pads.

10 Claims, 7 Drawing Sheets

METHOD OF CONSTRUCTION FOR MULTI-TIERED CAVITIES USED IN LAMINATE CARRIERS

FIELD OF THE INVENTION

This invention relates generally to the lamination and circuitization of substrates for use as chip carriers, and more particularly to an improved technique for forming either single chip module laminates (SCML) or multiple chip module laminates (MCML) which have openings formed therein for the receipt of integrated circuit chips. More specifically, this invention is especially useful for forming SCMLs and MCMLs utilizing organic circuit board technology known as FR4 and other organic circuit board technology.

RELATED APPLICATIONS

Patent application of Bhatt, et al., Ser. No. 08/359,491, filed Dec. 20, 1994, entitled "Method of Laminating and Circuitizing Substrates Having Openings Therein" (Atty. Docket No. EN9-94-016).

BACKGROUND OF THE INVENTION

In the manufacture of circuit boards, especially for use in computers, various components are mounted on the board. Among these components are included integrated circuit (I/C) chips. Different techniques have been developed for mounting these I/C chips onto circuit boards. One of these techniques is a so-called direct chip attach (DCA), in which the chips are mounted along with other components directly onto the circuit board or mother board of the computer. This type of mounting does have certain attractive aspects; however, there are some serious limitations to direct chip attach. These limitations include the possibility of thermal mismatch of the silicon chips with the circuit board, which is typically formed of epoxy fiberglass (FR4 technology) which has a significantly different coefficient of thermal expansion (CTE) from that of the integrated circuit chip which may be formed of silicon. Moreover, if re-working of the circuit board is required because of defective chips, this is oftentimes very difficult to do and can, in extreme cases, result in totally scrapping the circuit board at the end of the manufacturing process.

In order to avoid the above difficulties, as well as others, one common technique for attaching I/C chips to circuit boards is by utilization of chip carriers. These chip carriers mount the I/C chips, which carriers are then in turn mounted to the circuit board. While this does introduce another level of packaging, nevertheless there are certain advantages to this type of chip mounting which in certain instances make it a more desirable mode of attaching a chip to the circuit board. With this technique, the integrated circuit chip is secured to a chip carrier either by solder ball connections or wire bonding. The chip carrier, with one or more chips attached thereto, is attached to the circuit board by various different technologies such as pin-in-hole, solder ball or other techniques. This utilization of a chip carrier has the advantage of allowing each of the chips to be tested individually or in small groups on the chip carriers before attaching to the board and indeed after attaching to the board, and if there is a defective or malfunctioning chip, that chip can be easily replaced. If it is not possible to replace the chip, then the chip carrier can be discarded without discarding or scrapping the entire circuit board at a late stage in the processing. This technique also allows for greater tolerances to thermal mismatch between the chip and the chip carrier for several reasons.

In one technique which utilizes a chip carrier, the carrier material can be selected which has a coefficient of thermal expansion between that of the integrated circuit chip and the organic material of the circuit board. One such type of carrier is a ceramic carrier which is well-known in the art.

Another factor in eliminating or minimizing the consequences of thermal mismatch between the chip and the circuit board material is that the chip carrier itself is relatively small as compared to the circuit board. Thus, the effect of thermal mismatch, vis-a-vis, the chip, is significantly reduced as compared to situations where there is direct chip attach with relatively small integrated circuit chips and a relatively large circuit board. Hence, a technique for mounting chips on carriers and carriers to circuit boards has been developed in which the same material is used for both the chip carrier and the circuit board, which in many instances is FR4 epoxy fiberglass material. By utilizing the same material for both the chip carrier and the circuit board, essentially identical technologies can be used to manufacture both the chip carriers and the circuit board, thereby reducing the number of technologies necessary to provide a finished product.

Technologies used to form epoxy fiberglass FR4 chip carriers include, among other things, lamination of several layers of the FR4 organic board together to form the chip carrier, and also include photolithographic techniques where photoresist, either positive-acting or negative-acting, is used to pattern the material for metal deposition. Because of their configurations, both of these processes can have certain detrimental effects on the manufacturing process which can lead to causing significant problems with the resultant chip carrier to the extent that it is unsatisfactory for the intended use. Thus, it is desirable to eliminate these problems in the FR4 technology.

In the above-noted parent application, Ser. No. 08/359,491, a technique for forming chip carriers having openings therein in which chips are mounted is described in which multiple layers with pre-formed openings therein are utilized. A plug is provided which fits in the openings and photoresist bridges over the opposite sides of the plug to protect the I/C chip area from damage during circuitization and other wet processing of the chip. While this technique works quite well in many instances, nevertheless it does require pre-drilling or other forming of the board components with aligned openings and requires the use of a separate piece which must be removed after processing and relies on the seal of photoresist to prevent unwanted contamination during wet processing. In some instances, this technique is not only more expensive, but has certain limitations on how it can be used.

SUMMARY OF THE INVENTION

According to the present invention, a method for forming a laminated structure and the resulting structure is provided. First and second relatively rigid planar elements are provided, each having first and second opposed surfaces. A bottomed cavity is formed in the first element, which cavity has a boundary surface extending from the first surface thereof and terminating adjacent, but spaced from, the second surface. A first surface of the second element is circuitized to provide the desired circuitry that will eventually be contained internally of the final product, which circuits include bond pads for bonding to a chip. The bond pads being arranged in a pattern corresponding to the boundary surface.

The first and second elements are laminated together with the first surface of each in opposed relationship to thereby form a structure having a closed, internal cavity defined by the cavity in the first element and the first surface of the second element, and with the bond pads disposed within the cavity. After the laminating of the two elements, through holes are drilled. Following the drilling of the holes, the second surface of the first element is circuitized, and the drilled holes are filled with conducting material to provide electrical connection between circuitization on the first surface of the second sheet and the circuitization on the second surface of the of the first element. This is preferably done using photoresist and plating (electro or electroless) techniques. Thereafter, the first and second elements are through routed to provide a through opening which extends through both of the elements, and the remaining surface or lip of the first element overlying the cavity thereof is then routed, which thereby forms a through opening in both of the elements with a step configuration on the second element, leaving the bond pads therein exposed. A heat sink in the form of a thin sheet of copper or other conductive material is preferably attached to the second surface of the second element. Thereafter, an integrated circuit chip is bonded to the bond pads, preferably using wire bonding. Also, the integrated circuit chip is bonded to a heat sink by thermal adhesive.

DESCRIPTION OF THE PREFERRED EMBODIMENTS

Figure 1:
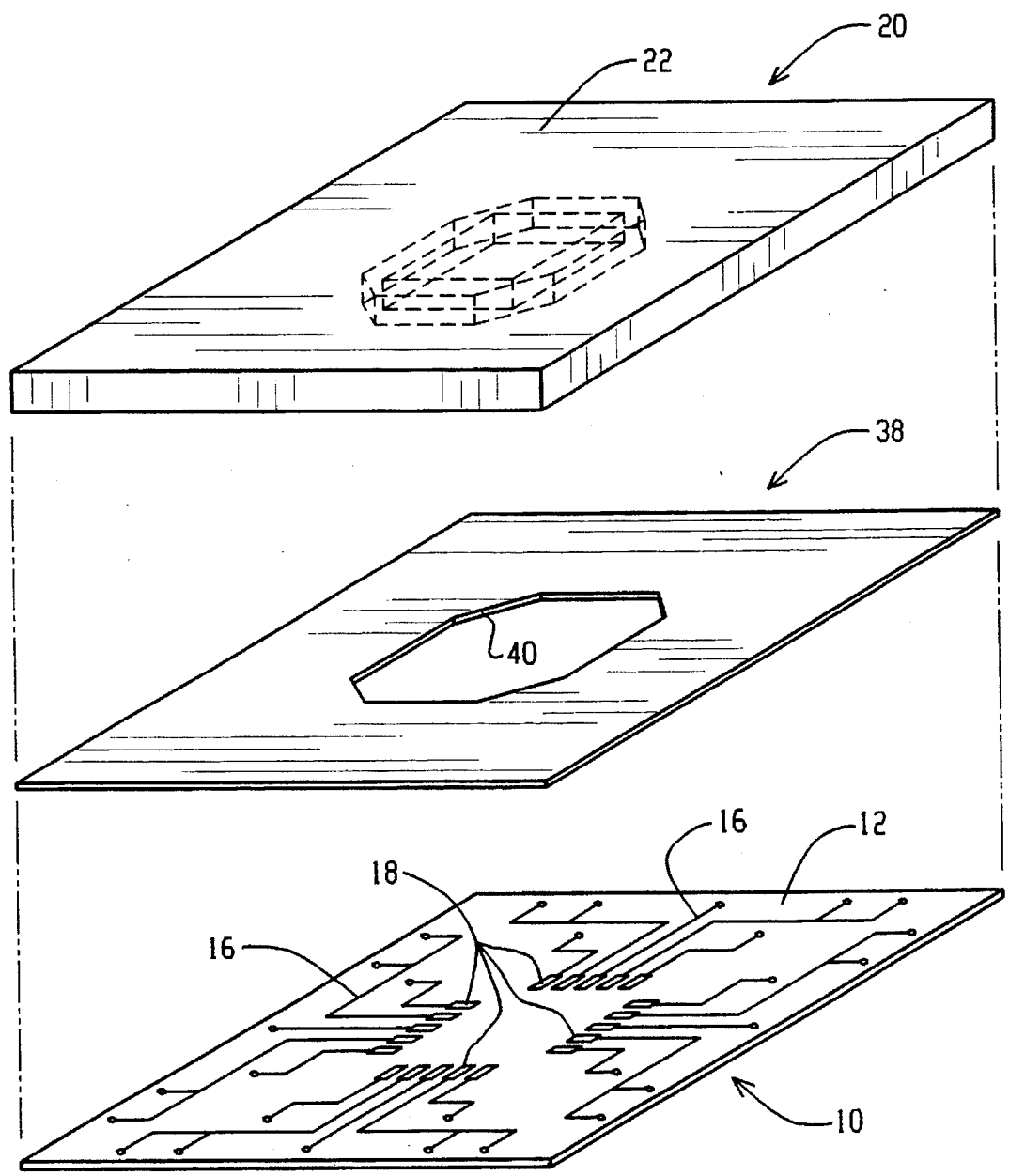
FIG. 1 is an exploded perspective view, somewhat diagrammatic, showing the various layers of a single chip module laminate structure ready for lamination of the components.
Figure 2:
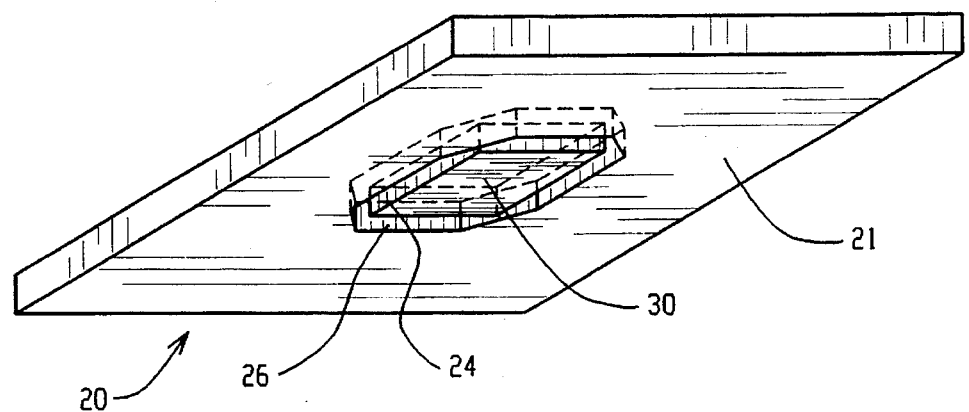
FIG. 2 is a bottom perspective view of the cap member of the components.
Figure 3:
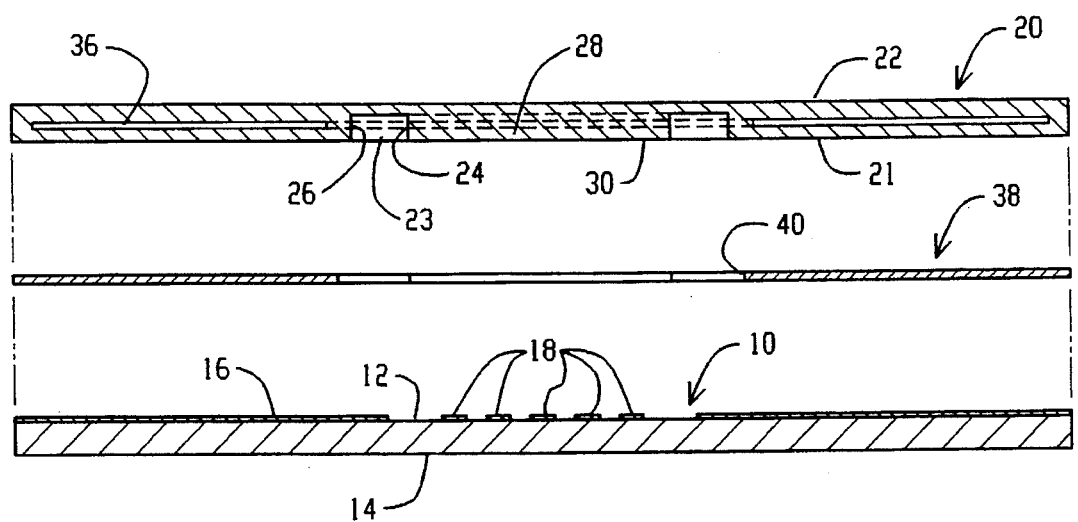
FIG. 3 is an exploded sectional view of the components ready for lamination.
Figure 4:
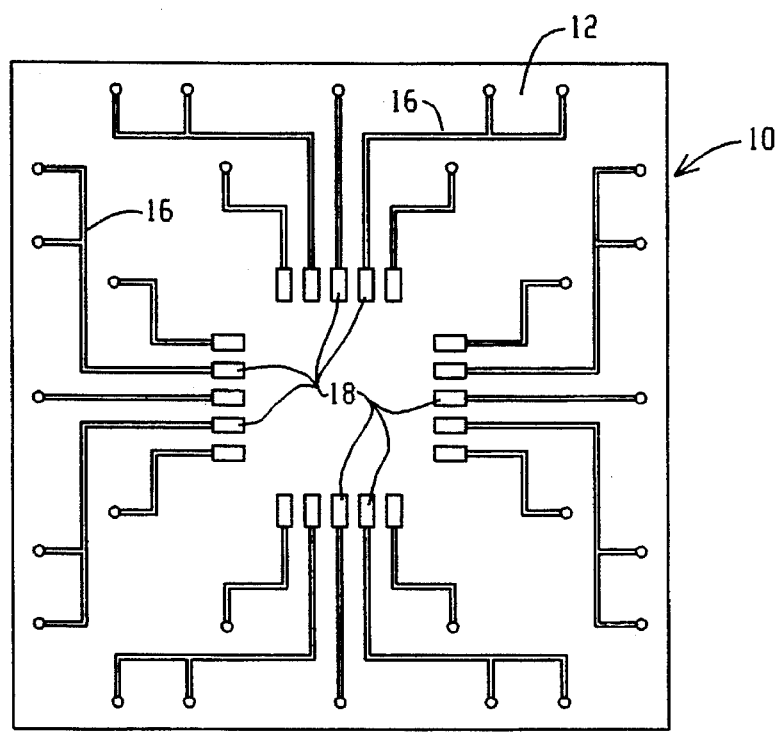
FIG. 4 is a top plan view of the substrate element having electrical circuitization thereon.

Before describing the process in detail, it should be noted that the embodiment described in detail of the present invention constitutes a process for forming a single chip module laminate (SCML) utilizing epoxy fiberglass technology known as FR4 organic circuit board technology. It is to be understood, however, that the technology is equally applicable to other laminated organic structures which can be processed, including routing, to produce the desired structure. Also, the embodiment described in detail is the embodiment which produces a laminate structure in which a single chip is mounted on a single interior step of the module forming the laminated chip carrier. It is to be understood, however, that multiple-module chip carriers can be formed utilizing this technique, as well as chip carriers having multiple internal steps as will be apparent from the description of the preferred embodiment.

In the lamination processes, application of pressure and usually heat to superimposed sheets of materials results in a viscus flow of material such as epoxy impregnated fiberglass sheets (prepreg) used to join the various laminates which are used in SCML and multiple chip module laminate (MCML) processes.

Referring now to the drawings and for the present to FIGS. 1–4, various components for forming an SCML chip carrier are shown somewhat diagrammatically and in exploded configuration (in FIGS. 1 and 3) ready to be assembled to form the structure according to the present invention. The SCML in this embodiment is comprised of a substrate 10, having a top surface 12 and a bottom surface 14. The substrate 10 is formed of FR4 technology, which, as described in the above-noted parent application is epoxy impregnated fiberglass cloth. The impregnated fiberglass cloth is fully cured to form a relatively rigid planar structure typically between about 0.010 to 0.040 inches thick. The substrate 10 has electrical circuitry 16 formed on the side 12 thereof. The electrical circuitry 16 includes bond pads 18 arranged in a square pattern, the arrangement of which will be described later.

A cap 20 is provided which also is formed of epoxy impregnated fiberglass fully cured to form a relatively rigid planar structure having a lower surface 21 and an upper surface 22. The cap 20 has a routed out portion 23, which is defined by an inner surface 24 and an outer surface 26 which routed out portion 23 defines a cavity surrounding or defining a pedestal 28. The pedestal 28 has an end surface 30. The outer surface 26 of the routed portion 22 is preferably in the form of a hexagon or a square, although other shapes may be used. The inner surface 24 is preferably in the form of a square (although other shapes may be used) which thus defines the pedestal 28 as being essentially square in transverse cross-section. The routed out portion 23 extends from the lower surface 21 of the cap 20 and terminates short of the upper surface 22 so that the routed portion 23 defines essentially a cavity open only at the lower surface 21 and closed at the outer sides 26 and top surface 22. The substrate 10 is typically about 0.010 to 0.040 inches thick, and is of sufficient thickness to allow for an embedded power plane 36, if required, to be encapsulated therein during the laminating process used to form the cap 20. The thickness of the cap and thickness of the substrate do not have to be the same. Typically the cap 20 is formed by laminating various layers of epoxy impregnated fiberglass sheets.

A sticker sheet 38 is provided which is interposed between the substrate 10 and the cap 20, and is used to laminate the substrate 10 to the cap 20 to form the composite chip carrier structure. The sticker sheet 38 is very thin, e.g., 0.002 to 0.004 inches thick, and is formed of epoxy impregnated fiberglass which is partially cured to form a solid sheet of material, which curing is generally referred to as a B cure resulting in a partially polymerized epoxy resin impregnated fiberglass cloth, often referred to as "prepreg", all as described in the related application. The sticker sheet 38 has a central octagonal opening 40 which is slightly larger than the octagonal surface 26 in the cap 20. The edge of the sticker sheet's opening 40 around the opening 26 is spaced about 0.010 inches outwardly from the opening 26. This is to prevent a flow of the sticker sheet material 38 during lamination onto the bonding pads 18 so as to prevent this material from covering the pads and thus make them non-useful for electrical contacts.

These are conventional materials used in conventional laminating procedures to join substrates of fully-cured fiberglass epoxy FR4 structures.

Figure 6A:
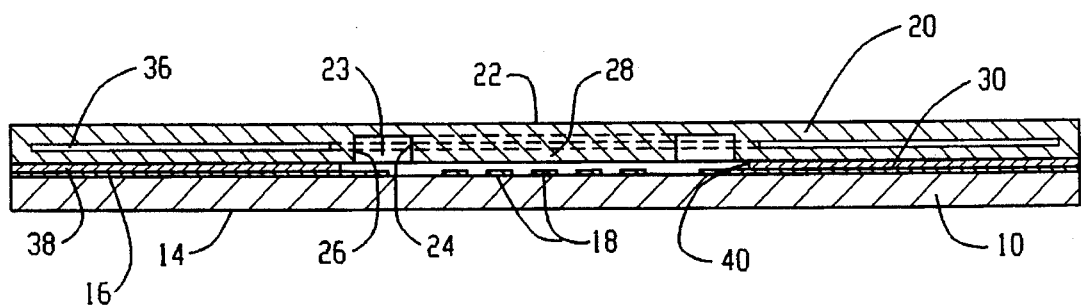
FIGS. 6A–6H are views showing sequentially the steps of forming the structure and mounting an I/C chip according to the present invention.

Referring now to FIGS. 6A–6H, the various steps in the forming of the chip mounting module are shown somewhat diagrammatically, in cross-section, utilizing the substrate 10, the cap 20 and the sticker sheet 38. As can be seen in FIG. 6A, the substrate 10, the cap 20 and the sticker sheet 38 are placed in superimposed relationship and are then laminated together by conventional laminating processes using heat and pressure. During the lamination process, pressure and heat are provided which cause the bonding or lamination to occur. One typical epoxy used for the sticker sheet 38 has a $T_g$ of about 134° C. and another of about 170° C. In any event, some flow will occur which will be dependent on the various factors, such as temperatures and pressures used in laminating, as well as the pickup and flow characteristics of the sticker sheet material 38, all of which is well-known in the art.

During the lamination process, the epoxy material of the sticker sheet 38 will flow. However, as indicated previously, the edge of the opening 40 of the sticker sheet 38 is spaced from the edge of the opening 26 in the cap 20 by about 0.010 inches. This spacing is important as indicated in the related application in that the edge must be close enough to the opening 26 so that when the sticker sheet 38 flows, it will not leave any significant void regions or unbonded regions, since void or unbonded regions are detrimental in future processing steps. On the other hand, the edge of the opening 40 of the strip 38 cannot be so close to the edge 26 so as to flow out and significantly cover the bonding pads 18 on the substrate 10.

It should be noted that since the sticker sheet 38 is very thin, pressure exerted during lamination causes the end surface 30 of the pedestal 28 to abut the top surface 12 of the substrate 10 during the lamination process. This assures a relatively uniform pressure across the top surface 22 of the cap 20 during lamination, and prevents any bowing or rippling that might occur if the pedestal were not present and the routed out cavity 23 were to occupy this entire region around the wall 26. This could result in uneven application of the photoresist, which will be described presently, and which uneven application can cause poor adhesion thereof with the attendant problems associated therewith After the lamination has taken place, the structure has the form of that shown in FIG. 6A, with the routed out portion 23 together with the top surface 12 of the substrate 10 forming an essentially closed cavity, and with the bonding pads 18 disposed in the cavity.

Figure 6B:
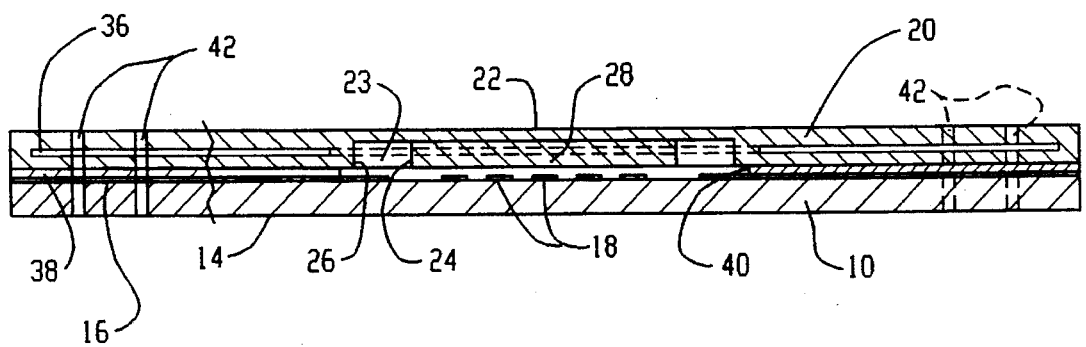

Thereafter, as shown in FIG. 6B, holes or vias 42 are drilled through both the cap 20 and the substrate 10 so as to provide for electrical connection (when the holes are filled with conducting material) between the circuitization 16 on the substrate 10 and the circuitization which is to be applied to the cap in the following steps, as will be described. The holes 42 are chemically cleaned by the use of $KMnO_4$ and burtyl carbitol.

Following the drilling and the cleaning of the holes 42, circuitization is applied to the top surface 22 of the cap 20 and to the holes 42 utilizing conventional photoresist and plating processes. To this end, the surface 34 is covered with a film of photoresist which is then exposed and developed in the areas where circuitization is to be applied to the surface and over the through holes 42. This will reveal the position of the underlying surface 22 to be plated as well as reveal the holes, also to be plated. The preferred circuitization process is additive plating which can be done by utilizing either positive-acting or negative-acting photoresist. It is preferred that a negative-acting photoresist be used. Dupont Photoresist T168 is one resist which is well suited for this use. Dupont Photoresist 3120 can be used if subtractive electro-etch or related techniques are used. Both of these are negative-acting resists, i.e. they will be developed and washed away after development where not exposed by actinic radiation.

Figure 6C:
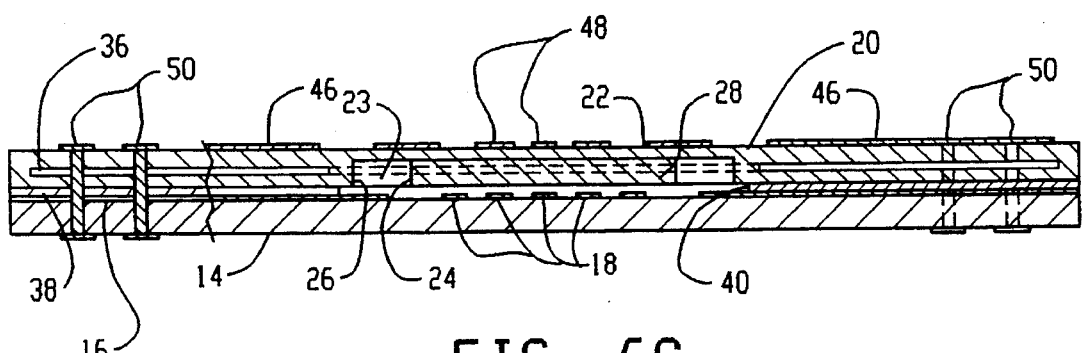

According to conventional practice, the photoresist is applied, exposed and developed, and thereafter conventional wet copper plating processes are used to plate copper on the areas exposed on the surface 22 of the cap 20 and in the holes 42. This can be either electro or electroless plating. This will result in the circuitization 46 being formed on revealed portions of the surface 22, which circuitization includes bond pads 48 and metalization 50 in the holes or vias 42. This configuration is shown in FIG. 6C. It will be noted that the wet processing, i.e., the developing of the photoresist and the plating of the copper, has been done with the routed out portion 23 forming a cavity which protects the bond pads 18 from exposure to the various chemicals used during all of the wet processes, including the hole cleaning. These wet processes employ strong reagents such as potassium permanganate to clean and smooth the hole, as well as the various reagents used to develop and strip the photoresist and plate the copper. These can adversely affect the metalization 16 including the bond pads 18 on the substrate 10 if exposed to these reagents. (It should be noted that, although circuitization of the upper surface 22 of the cap 20 is preferably performed after lamination and together with metalization of the holes 42, it is technically feasible to circuitize the upper surface 22 of the cap 20 before lamination, then, subsequent to the lamination, drill the vias and plate them with metal. However, this requires two plating operations and it is preferred to do the plating in one single operation.)

Figure 5:
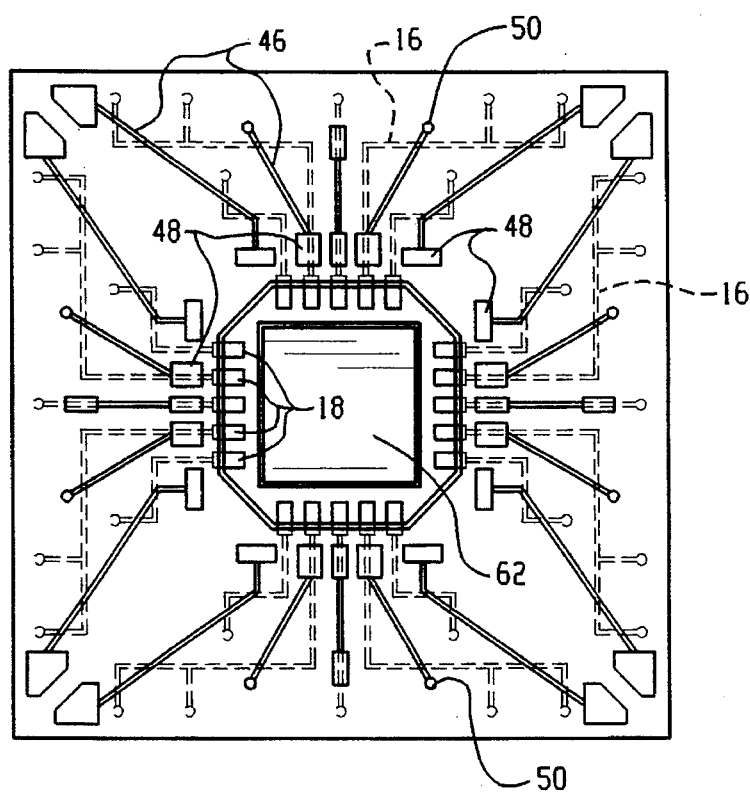
FIG. 5 is a top plan view of the composite structure after lamination, circuitization, and routing.
Figure 6D:
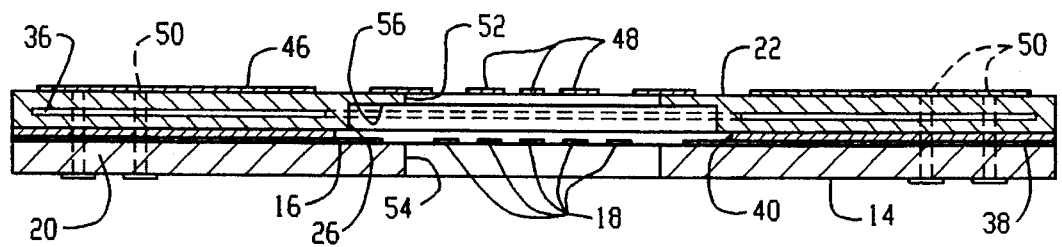
Figure 7:
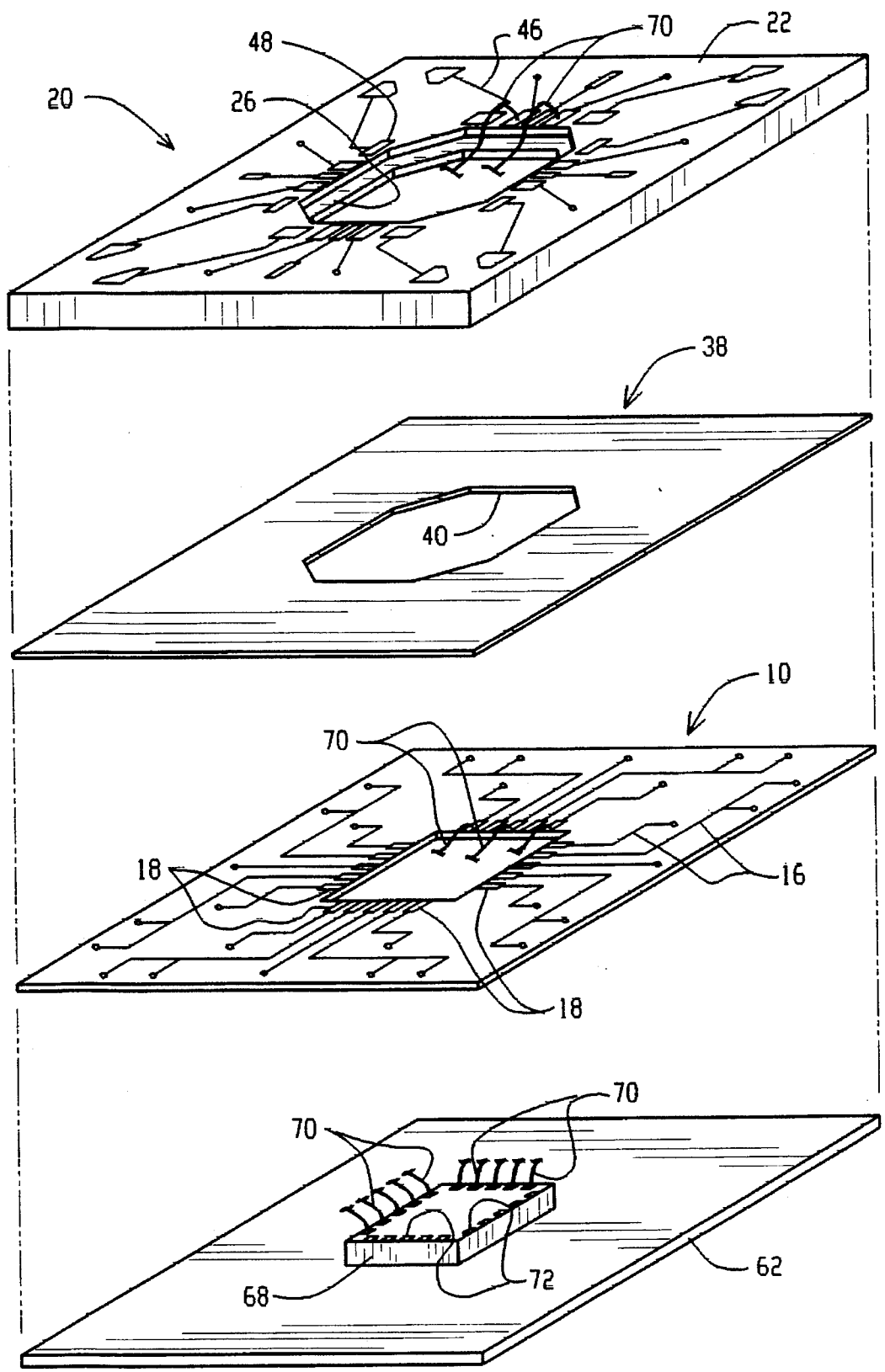
FIG. 7 is an exploded perspective view of the finished product with an I/C chip mounted thereon.

Once this metalization and this wet processing with the strong reagents has been completed, the cavity is opened. Referring now to FIG. 6D, the cap 20 and the substrate 10 are routed with a through router to provide square openings 52 and 54 which extend through the cap 20 and the substrate 10. This removes the pedestal 28 in the cap 20 and thus provides access both through the substrate 10 and cap 20 to the bond pads 18. As can be seen in FIGS. 5 and 7, the bond pads 18 surround the opening 54, and, of course, the pedestal 28 has been removed with this routing. This configuration, as shown in FIG. 6D, results in a lip 56 on the cap 20 which overlies but is spaced from the surface 12 of the substrate 10.

Figure 6E:
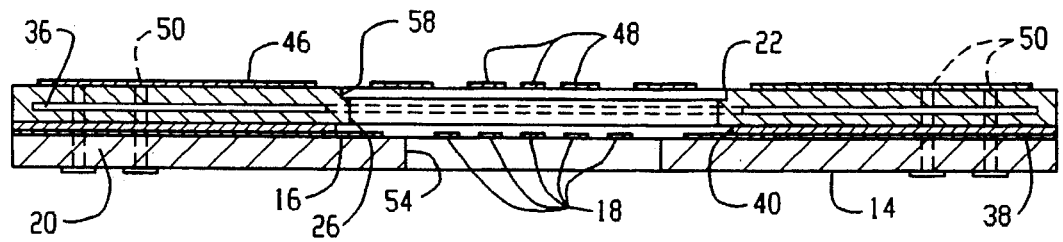

As shown in FIG. 6E, this lip 56 is removed by routing to form an octagonal opening 58, thereby totally exposing the bond pads 18 on the surface 12. Also, the bond pads 48 are arranged so that they surround the opening 58 which is hexagonal in shape, matching the shape but being slightly smaller than the opening 40 and the sticker sheet 38.

Figure 6F:
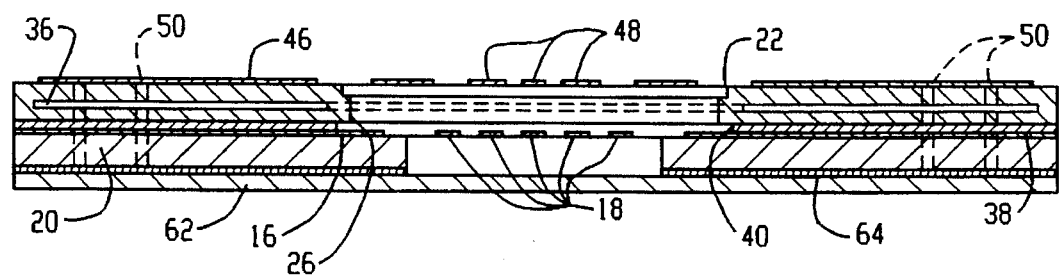

It is usually preferred to employ a heat sink, and to this end, a thin sheet of copper 62 is bonded by an epoxy 64 to the bottom surface of the substrate 10 as shown in FIGS. 5 and 6F. (If components such as capacitors or resistors are to be mounted on surface 14, suitable cut-outs or openings, not shown, can be provided in the sheet of copper 62.) At this point, the carrier thus far formed will then be subject to a gold plating process where the exposed surface of the copper circuitry is plated with a thin layer of gold to allow for the bonding of the wires thereto. Such gold plating processes are well-known in the art. Since plating is not required on the copper heat sink 62, it can be protected, such as by photoresist material, to prevent the unneeded expense of plating gold thereon. The photoresist can be removed, if desired, after gold plating.

Figure 6G:
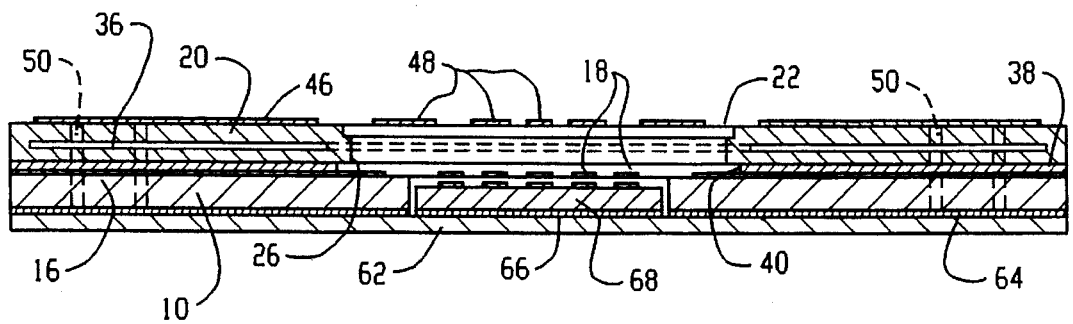

The chip carrier is now in condition for the reception of an integrated circuit chip. As shown in FIG. 6G, an integrated circuit chip 68 is bonded to the heat sink 62 by a thermally conducting adhesive 66 which in the preferred embodiment is a commercially-available silver impregnated epoxy. The chip 60 fits into the opening 54.

Figure 6H:
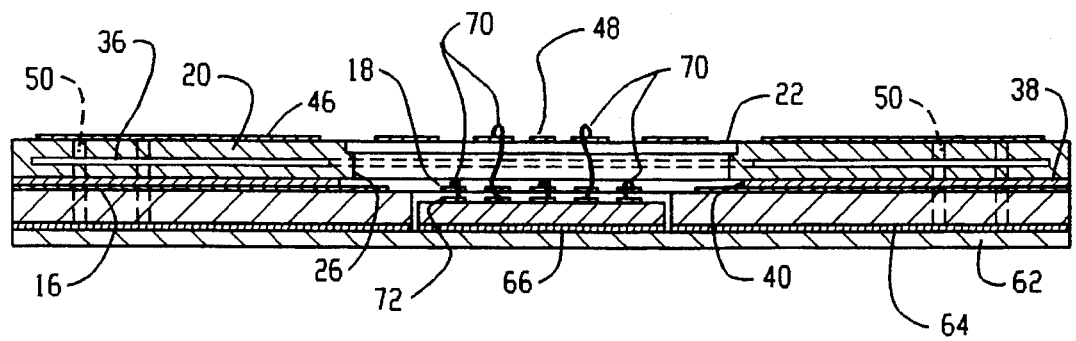

Bond wires 70 are provided, some of which connect bond pads 72 on chip 68 to the bond pads 18 on the substrate 10, and some of which connect bond pads 72 to the bond pads 48 on the cap 20. This is shown in FIG. 6H and also the final configuration of the carrier with the I/C chip mounted thereon is shown in exploded view in FIG. 7.

If desired, an encapsulant can be placed over the wire bonds 70 on the pads 72, 18 and 48 to provide protection from the atmosphere. One suitable encapsulant is an epoxy molding material sold by the Dexter Company under the name HYSOL 4450.

The entire structure thus formed can be mounted to a substrate utilizing solder ball technology to connect the circuitry 46 to pads on a circuit board.

Accordingly, the preferred embodiment of the present invention has been described. With the foregoing description in mind, however, it is understood that this description is made only by way of example, that the invention is not limited to the particular embodiments described herein, and that various rearrangements, modifications, and substitutions may be implemented without departing from the true spirit of the invention as hereinafter claimed.

What is claimed is:

1. A method of forming a laminated structure comprising the steps of:

providing first and second relatively rigid planar elements, each having first and second opposed surfaces, forming a bottomed cavity in said first element, said cavity having a boundary surface extending from the first surface thereof and terminating adjacent to, but spaced from, said second surface of said first element, forming electrical circuitry on said first surface of said second element, said electrical circuitry including bond pads arranged in a pattern corresponding to the configuration of said boundary surface of said cavity in said first element, joining said first and second elements together with the first surface of each element in opposed juxtaposed relationship to thereby form a structure having a closed internal cavity, with said bond pads being located within said cavity, forming electrical circuitry on said second surface of said first element;

forming electrical connection between the electrical circuitry on said first surface of said second element and said electrical circuitry on said second surface of said first element, removing the portion of said first element covering said cavity to thereby provide an opening from said second surface of said first element to said cavity, and providing an integrated circuit chip, and bonding said integrated circuit chip to said bond pads on the second element.

2. The method as defined in claim 1 wherein material is removed from said second element to form a through opening surrounded by said bond pads.

3. The method of claim 2 wherein a chip mounting structure is formed across said opening in said second element, and said I/C chip is mounted thereon.

4. The method of claim 3 wherein said chip structure is formed of a heat conducting material to thereby form a heat sink.

5. The method as defined in claim 1 wherein said cavity is generally ring-shaped surrounding a pedestal circumscribed by said cavity, and which pedestal extends substantially to the first surface of said first element, and wherein said pedestal is removed after circuitization of said second surface of said first element.

6. The method as defined in claim 5 wherein the material of said second element adjacent said pedestal is also removed to thereby form an opening through said laminated structure, and a chip mounting structure is connected across said opening in said second element.

7. The method as defined in claim 6 wherein said cavity is octagonal.

8. The method as defined in claim 1 wherein the elements are epoxy circuit board elements and are joined by laminating.

9. The method as defined in claim 8 wherein said epoxy elements are partially cured before laminating and are connected by the application of heat and pressure.

10. The method as defined in claim 9 wherein a film of epoxy is used to laminate said first and second elements together.

* * * * *